(12) United States Patent
Jun

(10) Patent No.: US 8,173,500 B2
(45) Date of Patent: May 8, 2012

(54) POLY-EMITTER TYPE BIPOLAR JUNCTION TRANSISTOR, BIPOLAR CMOS DMOS DEVICE, AND MANUFACTURING METHODS OF POLY-EMITTER TYPE BIPOLAR JUNCTION TRANSISTOR AND BIPOLAR CMOS DMOS DEVICE

(75) Inventor: Bon-Keun Jun, Buk-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 173 days.

(21) Appl. No.: 12/546,259

(22) Filed: Aug. 24, 2009

(65) Prior Publication Data

US 2010/0051946 A1   Mar. 4, 2010

(30) Foreign Application Priority Data

Sep. 2, 2008   (KR) .................. 10-2008-0086324

(51) Int. Cl.
  *H01L 21/8238*   (2006.01)
(52) U.S. Cl. ......... 438/202; 438/203; 438/204; 438/205
(58) Field of Classification Search ........... 438/202–205
  See application file for complete search history.

(56) References Cited

U.S. PATENT DOCUMENTS

| | | | | |
|---|---|---|---|---|
| 5,763,931 A * | 6/1998 | Sugiyama | ..................... | 257/506 |
| 5,913,114 A * | 6/1999 | Lee et al. | ..................... | 438/202 |
| 6,359,318 B1 * | 3/2002 | Yamamoto et al. | ........... | 257/378 |
| 6,528,375 B2 * | 3/2003 | Gregory | ..................... | 438/302 |
| 6,753,592 B1 | 6/2004 | Husher | | |
| 7,164,174 B2 * | 1/2007 | Springer | ..................... | 257/370 |
| 2004/0033666 A1 | 2/2004 | Williams et al. | | |

FOREIGN PATENT DOCUMENTS

| | | |
|---|---|---|
| KR | 10-1999-002164 | 1/1999 |
| KR | 1020010058826 | 7/2001 |
| KR | 10-0523053 | 10/2005 |

\* cited by examiner

*Primary Examiner* — Thien F Tran
(74) *Attorney, Agent, or Firm* — Sherr & Vaughn, PLLC

(57) ABSTRACT

A poly-emitter type bipolar transistor includes a buried layer formed over an upper portion of a semiconductor substrate, an epitaxial layer formed on the semiconductor substrate, a collector area formed on the epitaxial layer and connected to the buried layer, a base area formed at a part of an upper portion of the epitaxial layer, and a poly-emitter area formed on a surface of the semiconductor substrate in the base area and including a polysilicon material. A BCD device includes a poly-emitter type bipolar transistor having a poly-emitter area including a polysilicon material and at least one of a CMOS and a DMOS formed on a single wafer together with the poly-emitter type bipolar transistor.

8 Claims, 3 Drawing Sheets

Figure 1:
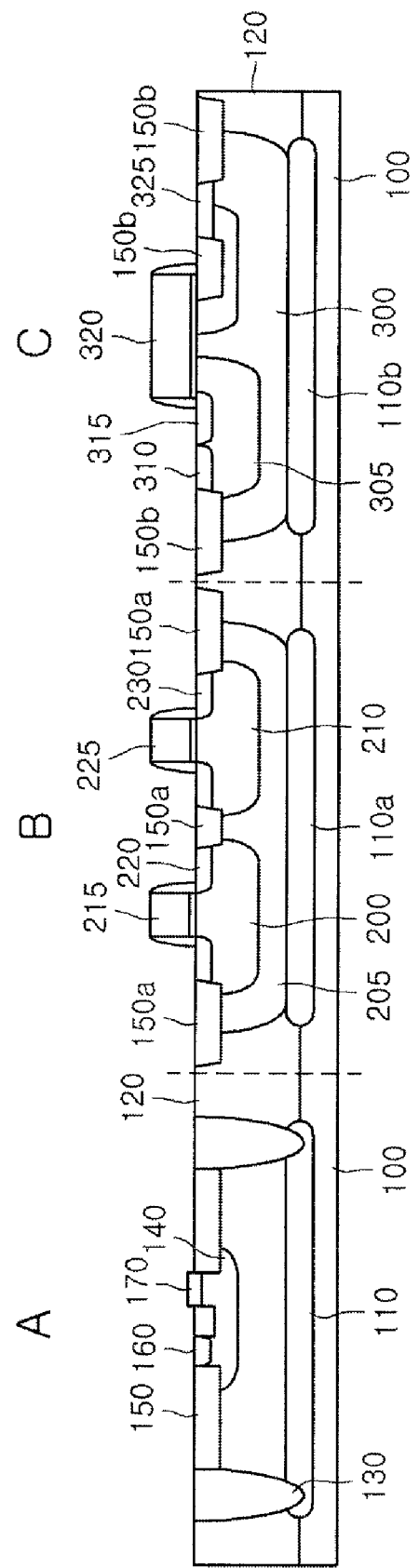

POLY-EMITTER TYPE BIPOLAR JUNCTION TRANSISTOR, BIPOLAR CMOS DMOS DEVICE, AND MANUFACTURING METHODS OF POLY-EMITTER TYPE BIPOLAR JUNCTION TRANSISTOR AND BIPOLAR CMOS DMOS DEVICE

The present application claims priority under 35 U.S.C. 119 to Korean Patent Application No. 10-2008-0086324 (filed on Sep. 2, 2008), which is hereby incorporated by reference in its entirety.

BACKGROUND

A bipolar device, a CMOS (Complementary Metal Oxide Semiconductor), and a DMOS (Double diffusion MOS) can be formed in a single wafer by using a BCD process. Besides the bipolar device, the CMOS and the DMOS, a logic circuit, a PMOS, an NMOS, a resistor, a capacitor and a diode can be integrated in a single chip through the BCD process. For instance, a bipolar transistor can be manufactured while the CMOS and the DMOS are being manufactured through the BCD process.

The bipolar transistor has a structure employing a junction emitter. Therefore, in the case of the bipolar transistor manufactured through the related BCD process, it processes to improve the high frequency characteristics, to increase the amplification gain and breakdown voltage and to widen the operational range are limited.

SUMMARY

Embodiments relate to a poly-emitter type bipolar junction transistor, a BCD (Bipolar CMOS DMOS) device, a manufacturing method of the poly-emitter type bipolar junction transistor and a manufacturing method of the BCD device. Embodiments relate to a poly-emitter type bipolar junction transistor, a manufacturing method of the bipolar junction transistor by using the BCD process, a BCD device, and a manufacturing method of the BCD device by using the BCD process.

A poly-emitter type bipolar transistor according to embodiments may include a buried layer formed over an upper portion of a semiconductor substrate; an epitaxial layer formed over the semiconductor substrate; a collector area formed on the epitaxial layer and connected to the buried layer; a base area formed over an upper portion of the epitaxial layer; and a poly-emitter area formed over a surface of the semiconductor substrate in the base area and including a polysilicon material.

A BCD device according to embodiments may include a poly-emitter type bipolar transistor having a poly-emitter area including a polysilicon material; and at least one of a CMOS and a DMOS formed on a single wafer together with the poly-emitter type bipolar transistor.

A method for forming a poly-emitter type bipolar transistor according to embodiments may include forming a buried layer over an upper portion of a semiconductor substrate; forming an epitaxial layer on the semiconductor substrate and forming a collector area connected to the buried layer on the epitaxial layer; forming an isolation layer that defines a base area and an emitter area; forming the base area on a substrate area below the isolation layer; forming a base electrode on a part of an upper portion of the base area; and forming a poly-emitter area including a polysilicon material on a part of an upper portion of the base area which is spaced apart from the base electrode by the isolation layer.

A method for manufacturing a BCD device through a BCD process according to embodiments may include forming a poly-emitter area of a bipolar transistor using a polysilicon material.

DRAWINGS

Example FIG. 1 is a side sectional view showing a BCD device including a poly-emitter type bipolar transistor according to embodiments.

Example FIGS. 2 to 7 are sectional views showing the manufacturing procedure for a poly-emitter type bipolar transistor according to embodiments.

DESCRIPTION

Hereinafter, a poly-emitter type bipolar transistor, a BCD device, a method for manufacturing the poly-emitter type bipolar transistor, and a method for manufacturing the BCD device will be described in detail with reference to accompanying drawings.

Example FIG. 1 is a side sectional view showing the BCD device including the poly-emitter type bipolar transistor according to embodiments. The BCD device according to embodiments is manufactured through the BCD process. In example FIG. 1, region "A" is a bipolar transistor region, region "B" is a CMOS region, and region "C" is a DMOS region.

Besides the poly-emitter type bipolar transistor, although not shown in example FIG. 1, a logic circuit, a PMOS, an NMOS, a high-voltage MOS, an intermediate-voltage MOS, a low-voltage MOS, a DEMOS (Drain Extended MOS), an LDMOS (Lateral Double diffused MOS), a resistor, a capacitor, and a diode can be integrated in a single chip according to the method for manufacturing the BCD of embodiments.

Referring to example FIG. 1, the poly-emitter type bipolar transistor includes a buried layer 110, an epitaxial layer 120, a collector area 130, a base area 140, a base electrode 160, an isolation layer 150, and a poly-emitter area 170, which are formed on a substrate 100 in the bipolar transistor region A.

The CMOS includes a PMOS and an NMOS in the CMOS region B. The PMOS is isolated from the NMOS by an isolation layer 150a. Each of the PMOS and the NMOS may include a buried layer 110a, a heavily doped N-type well 205, a P-type well 200, an N-type well 210, gates 215 and 225, and source/drain areas 220 and 230. The gates 215 and 225 may further include a gate insulating layer and a spacer.

The DMOS may include a buried layer 110b, a heavily doped N-type well 300, a P-type body 305, an isolation layer 150b for isolating each area, a gate 320, a P-type ion implantation area 310 and a first N-type ion implantation area 315 formed on the P-type body 305, and a second N-type ion implantation area 325 formed on the other side of the gate 320 in the DMOS region C. The isolation layer 150b formed between the gate 320 and the second N-type ion implantation area 325 may lengthen a current path between the P-type body 305 and the second N-type ion implantation area 325, so that the DMOS may serve as a high-voltage device.

Hereinafter, a method for manufacturing the BCD device including the poly-emitter type bipolar transistor according to embodiments will be described in detail with reference to example FIGS. 1 to 7. In embodiments, the poly-emitter type bipolar transistor may be manufactured simultaneously with the BCD device, so the following description will be focused on the poly-emitter type bipolar transistor formed in the bipolar transistor region A. Each process to be described below may be a single process or a complex process for manufacturing one or at least two from the group including the poly-emitter type bipolar transistor, the logic circuit, the PMOS, the NMOS, the high-voltage MOS, the intermediate-voltage MOS, the low-voltage MOS, the DEMOS, the LDMOS, the resistor, the capacitor, and the diode.

Example FIGS. 2 to 7 are sectional views showing the manufacturing procedure for the poly-emitter type bipolar transistor according to embodiments. First, the wafer-state semiconductor substrate 100, for instance, a single-crystal silicon substrate may be cut to a predetermined thickness. A surface of the semiconductor substrate 100 may be polished such that the epitaxial layer 120 can be formed on the surface.

Figure 2:
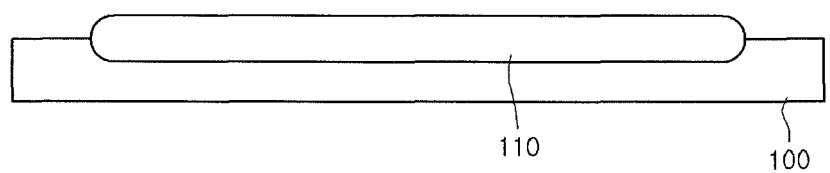
Figure 3:
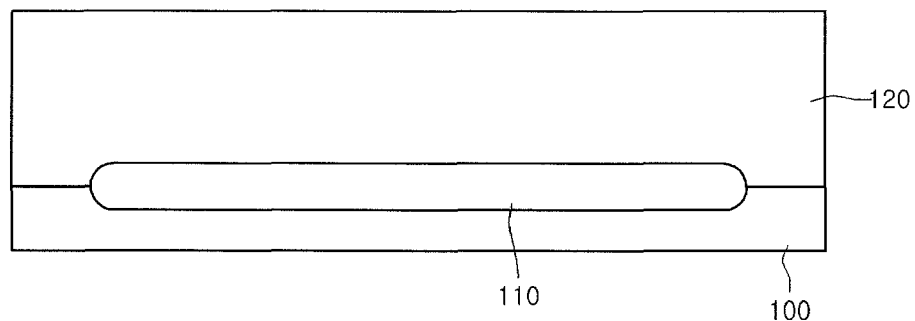

Then, as shown in example FIG. 2, an N type dopant may be implanted into a part of an upper portion of the semiconductor substrate 100 to form an N+ type buried layer 110. Then, an ion implantation area may be diffused through a heat treatment process. At this time, the buried layers 110a and 110b may also be formed in the CMOS area B and the DMOS area C of the substrate 100, respectively. After forming the N+ type buried layer 110, as shown in example FIG. 3, the epitaxial layer 120 may be formed by performing an epitaxial growth process with respect to the semiconductor substrate 100.

Figure 4:
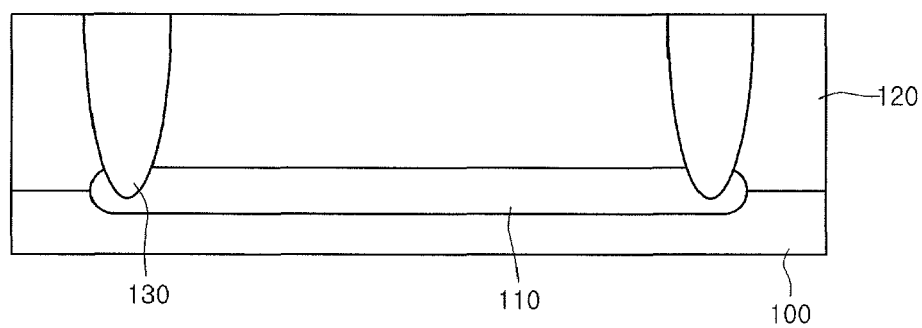
Figure 5:
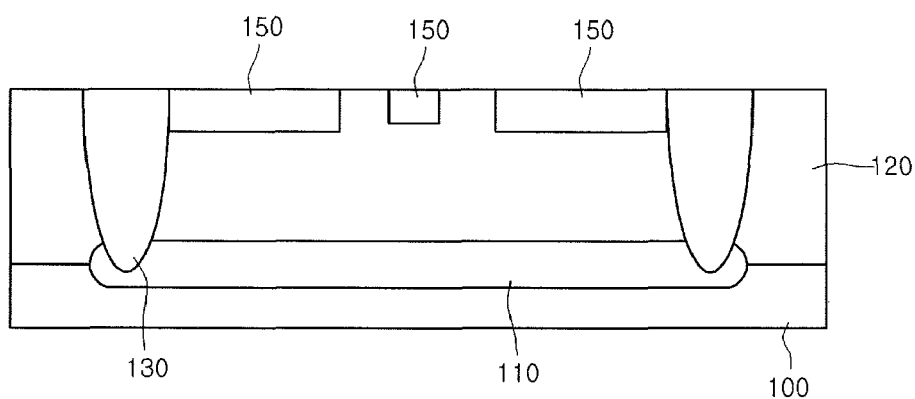

After forming the epitaxial layer 120, as shown in example FIG. 4, an N+ type diffusion area 130 connected to the N+ type buried layer 110 may be formed on the epitaxial layer 120. The N+ type diffusion area 130 may serve as the collector area. At this time, heavily doped N-type wells 205 and 300 can be simultaneously formed.

Then, the isolation layer 150 may be formed. As shown in example FIG. 5, the isolation layer 140 defines the base area and the emitter area while isolating the base area from the emitter area. At this time, the isolation layers 150a and 150b can be simultaneously formed in the CMOS region B and the DMOS region C. Then, an ion implantation mask process and an ion implantation process may be performed to form the P-type well 200 and the N-type well 210 in the CMOS region B and the P-type body 305 in the DMOS region C.

Figure 6:
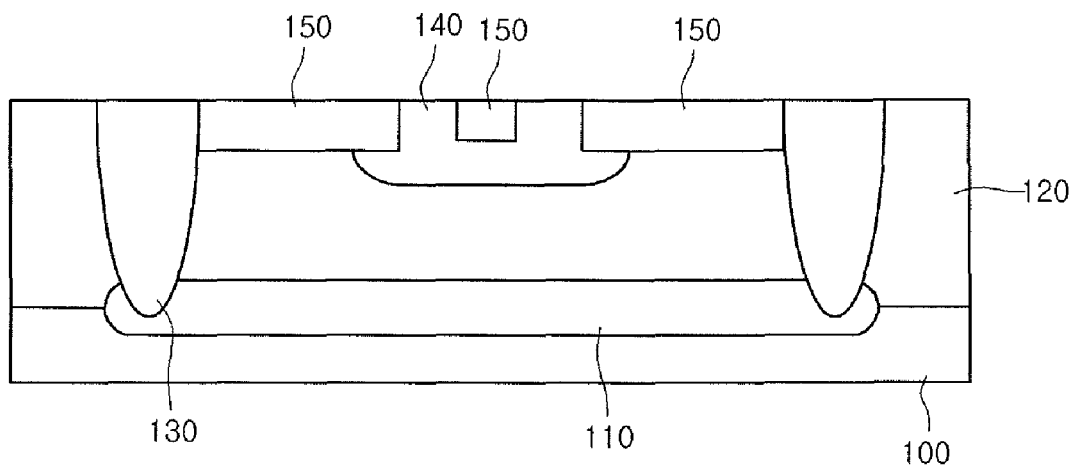
Figure 7:
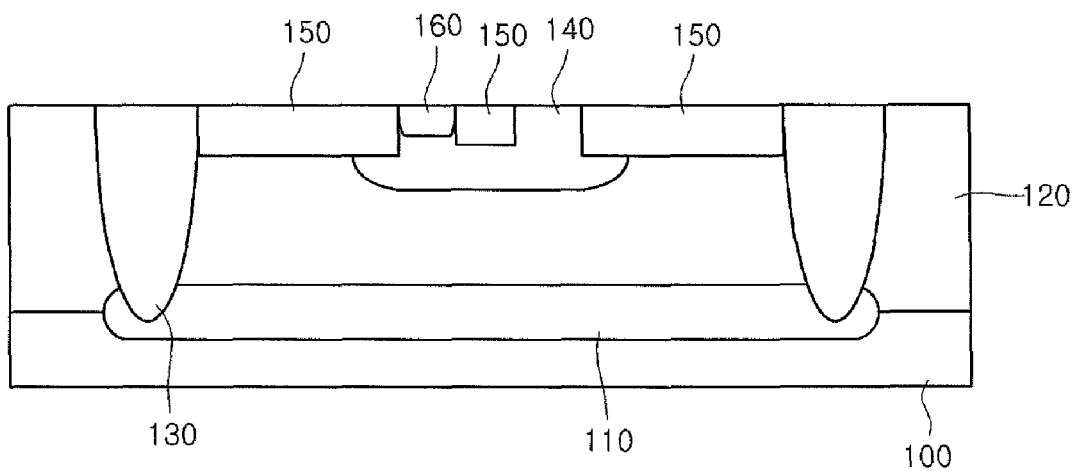

As shown in example FIG. 6, a P-type dopant may be implanted to form a P-type drift area 140 which serves as the base area. After forming the base area 140, as shown in example FIG. 7, the base electrode 160 may be formed. Then, an implant process may be performed with respect to the active area including the CMOS, the DMOS, the low-voltage NMOS, and the low-voltage PMOS, thereby adjusting threshold voltage.

After that, a process for forming the CMOS and gates 215, 225 and 320 of the DMOS is performed. At this time, the poly-emitter 170 of the poly-emitter type bipolar transistor according to embodiments may also be formed.

Then, the insulating layer may be formed over the entire surface of the substrate 100. The insulating layer may be patterned so that the gate insulating layers are formed in the CMOS region B and the DMOS region C. At this time, the insulating layer of the bipolar transistor area A is completely removed.

After that, a polysilicon layer may be coated on the entire surface of the substrate. A photoresist pattern may be formed on the polysilicon layer. The photoresist pattern defines the CMOS, the gates 215, 225 and 320 of the DMOS and the emitter area of the bipolar transistor. Then, the polysilicon layer is etched by using the photoresist pattern as an etch mask, thereby forming the gates 215, 225 and 320 and the poly-emitter 170.

The poly-emitter type bipolar transistor as shown in the region A of example FIG. 1 may be obtained through the above processes. Then, an N-type LDD (lightly doped drain) area and a P-type LDD area may be formed in each MOS region. The sidewall and the spacer may be formed at both sides of the gates 215, 225 and 320.

After forming the spacer, the source/drain areas 220 and 230 may be formed in the CMOS region B. The P-type ion implantation area 310, the first N-type ion implantation area 315 and the second N-type ion implantation area 325 may be formed in the DMOS region C.

Then, silicide may be formed on at least one of the poly-emitter 170, the base electrode 160, the gates 215, 225, 320, the source/drain areas 220 and 230, and the ion implantation areas 310, 315 and 325. In addition, processes for forming the insulating layer having a multi-layer structure, a contact plug, a metal interconnection and a protective layer can be further performed.

The BCD device including the poly-emitter type bipolar transistor according to embodiments can be obtained through the above processes. According to embodiments, the poly-emitter type bipolar transistor can be integrally formed with the BCD device in a single chip through the BCD process. Thus, a bipolar transistor having the superior frequency characteristics, high amplification gain and breakdown voltage, and wide operational range can be obtained.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming buried layers at upper portions of a bipolar transistor region, a CMOS region and a DMOS region of a semiconductor substrate, respectively;
    forming an epitaxial layer on the semiconductor substrate;
    forming a collector area connected to the buried layers on the epitaxial layer of the bipolar transistor region;
    forming an isolation layer that defines a base area and an emitter area;
    forming a well area on the epitaxial layer of the CMOS region and the DMOS region;
    forming the base area below the isolation layer in the semiconductor substrate of the bipolar transistor region, and forming the base electrode at an upper portion of the base area;
    forming gates at the CMOS region and the DMOS region of the semiconductor substrate; and
    forming a poly-emitter area at an upper portion of the base area, which is spaced apart from the base electrode by the isolation layer, in the bipolar transistor region.

2. The method of claim 1, wherein the poly-emitter area is formed simultaneously with the gates of the CMOS and the DMOS through a single process.

3. The method of claim 1, wherein a heavily doped well area is formed in the CMOS region and the DMOS region when the collector area is formed.

4. The method of claim 1, wherein the forming of the well area on the epitaxial layer of the CMOS region and the DMOS region comprises:
    forming at least one of a P-type well area and an N-type well area of the CMOS; and
    forming a P-type body of the DMOS.

5. The method of claim 1, wherein the forming of the gates and the poly-emitter area comprises:
    forming an insulating layer on the epitaxial layer including the gates and the isolation layer;

forming a gate insulating layer of the CMOS and the DMOS by patterning the insulating layer, and removing the insulating layer from the epitaxial layer including the bipolar transistor region;

forming a polysilicon layer on the epitaxial layer including the gate insulating layer; and forming gates on the gate insulating layer of the CMOS and DMOS by patterning the polysilicon layer and forming the poly-emitter on the emitter area defined by the isolation layer.

6. The method of claim 1, wherein at least one of a logic circuit, a high-voltage MOS, an intermediate-voltage MOS, a low-voltage MOS, a drain extended MOS, a lateral double diffused MOS, a resistor, a capacitor, and a diode is integrated in a single wafer together with the bipolar transistor.

7. The method of claim 1, including, after the gates and the poly-emitter are formed:

forming lightly doped drain areas at both sides of the gates of the CMOS and the DMOS;

forming a spacer; and forming source/drain areas in the CMOS region, forming a P-type ion implantation area and a first N-type ion implantation area in the P-type body, and forming a second N-type ion implantation area in the DMOS region which is spaced apart from the P-type body by the isolation layer.

8. The method of claim 7, including forming an insulating layer having at least one stack structure, a contact plug, and a metal interconnection after the source/drain areas and the ion implantation areas are formed.

* * * * *